US009146278B2

(12) United States Patent
Valdes et al.

(10) Patent No.: US 9,146,278 B2
(45) Date of Patent: Sep. 29, 2015

(54) SYSTEMS AND METHODS FOR MONITORING CIRCUIT BREAKER OPERATION

(71) Applicant: General Electric Company, Schenectady, NY (US)

(72) Inventors: Marcelo Esteban Valdes, Burlington, CT (US); Nataniel Barbosa Vicente, Prospect, KY (US)

(73) Assignee: General Electric Company, Schenectady, NY (US)

( * ) Notice: Subject to any disclaimer, the term of this patent is extended or adjusted under 35 U.S.C. 154(b) by 79 days.

(21) Appl. No.: 13/912,707

(22) Filed: Jun. 7, 2013

(65) Prior Publication Data

US 2014/0361780 A1 Dec. 11, 2014

(51) Int. Cl.
*G01R 31/02* (2006.01)
*G01R 31/327* (2006.01)
*G01R 31/333* (2006.01)
*H02H 3/04* (2006.01)
*H01H 71/04* (2006.01)

(52) U.S. Cl.
CPC .......... *G01R 31/3333* (2013.01); *G01R 31/327* (2013.01); *H02H 3/044* (2013.01); *H01H 2071/044* (2013.01); *H01H 2300/03* (2013.01)

(58) Field of Classification Search
None
See application file for complete search history.

(56) References Cited

U.S. PATENT DOCUMENTS

| 4,672,501 | A | 6/1987 | Bilac et al. |
| 6,252,365 | B1 | 6/2001 | Morris et al. |
| 6,980,407 | B2 | 12/2005 | Kawate et al. |
| 7,403,015 | B2 | 7/2008 | Carlino et al. |
| 7,532,955 | B2 | 5/2009 | Dougherty |
| 7,646,575 | B2 | 1/2010 | Weiher et al. |
| 7,889,472 | B1 | 2/2011 | Norman |
| 8,552,728 | B2 * | 10/2013 | Weiher .......................... 324/424 |
| 2002/0105768 | A1 | 8/2002 | Yamaguchi et al. |
| 2004/0189319 | A1 | 9/2004 | Stanisic et al. |
| 2009/0206059 | A1 | 8/2009 | Kiko et al. |

FOREIGN PATENT DOCUMENTS

GB 2419752 A 5/2006

OTHER PUBLICATIONS

Kezunovic et al., "Automated Circuit Breaker Monitoring", Power Systems Engineering Research Center, pp. 1-159, Nov. 2007.

* cited by examiner

*Primary Examiner* — Minh N Tang
(74) *Attorney, Agent, or Firm* — General Electric Company

(57) ABSTRACT

A control module coupled to a switching device that is switchable between an open state and a closed state as part of a switching event is provided. The control module includes a communication interface configured to issue a control signal to the switching device that triggers the switching device to switch between the open state and the closed state, and receive a feedback signal from the switching device indicating that the switching device has switched between the open state and the closed state. The control module further includes a processing device coupled to the communication interface and configured to calculate a characteristic time interval associated with the switching event, wherein the characteristic time interval is indicative of a mechanical switching time of the switching device, and a memory device coupled to the processing device and configured to store the calculated characteristic time interval.

20 Claims, 3 Drawing Sheets

SYSTEMS AND METHODS FOR MONITORING CIRCUIT BREAKER OPERATION

BACKGROUND

The field of the invention relates generally to circuit breakers and more particularly to monitoring circuit breaker operation over time.

Circuit breakers are often used to protect, in a residential, industrial, utility, or commercial environment, against overcurrent conditions, ground fault conditions, or other system anomalies that are undesirable and require the circuit breaker to open. In some circuit breakers, an electronic control system, referred to as a trip unit or an electronic trip unit or a relay, monitors one or more characteristics of electrical power to detect the presence of overcurrent conditions and causes an operating mechanism to separate circuit breaker contacts upon detection of an overcurrent condition by the trip unit. Separating the circuit breaker contacts, generally referred to as "tripping" the circuit breaker when caused by protection reasons or opening the circuit breaker when caused by control reasons, interrupts the flow of current through the circuit breaker.

In industrial settings, for example, the electronic control system serves to prevent damage to equipment and machines that, in many cases, represent a significant investment by a business and on whose operation the business relies. The electronic control system carries out this function by monitoring electrical current through a line. If the current exceeds a certain threshold, the electronic control system opens a circuit breaker on the line, thereby preventing excessive current from reaching devices or conductors that would be damaged by the excessive current. Circuit breakers may also be utilized in a variety of other applications.

Over a period of time, circuit breakers may degrade, resulting in slower switching times for both opening and closing operations. As a switching time increases, the quality of the protection provided by the circuit breaker to prevent excess current from reaching downstream devices may be degraded. Degraded circuit breakers can be maintained, repaired, or replaced to maintain acceptable performance levels. However, in at least some known power distribution systems, maintenance personnel may not be aware that a circuit breaker is degrading until the circuit breaker becomes wholly inoperable or the circuit breaker is called upon to operate and then operates slower than desired or initially planned.

BRIEF DESCRIPTION

In one aspect, a control module coupled to a switching device that is switchable between an open state and a closed state as part of a switching event is provided. The control module includes a communication interface configured to issue a control signal to the switching device that triggers the switching device to switch between the open state and the closed state, and receive a feedback signal from the switching device indicating that the switching device has switched between the open state and the closed state. The control module further includes a processing device coupled to the communication interface and configured to calculate a characteristic time interval associated with the switching event, wherein the characteristic time interval is indicative of a mechanical switching time of the switching device, and a memory device coupled to the processing device and configured to store the calculated characteristic time interval.

In another aspect, a system for monitoring switching device operation is provided. The system includes a switching device configured to switch between an open state and a closed state as part of a switching event to control a current through a conductor, and a control module communicatively coupled to the switching device. The control module is configured to issue a control signal to the switching device that triggers the switching device to switch between the open state and the closed state, receive a feedback signal from the switching device indicating that the switching device has switched between the open state and the closed state, and calculate a characteristic time interval associated with the switching event, wherein the characteristic time interval is indicative of a mechanical switching time of the switching device.

In yet another aspect, a method for monitoring operation of a switching device is provided. The method includes calculating, using a processing device, a characteristic time interval associated with each of a plurality of switching events, wherein each characteristic time interval is indicative of a mechanical switching time of the switching device, storing the plurality of calculated characteristic time intervals in a memory device communicatively coupled to the processing device, and tracking the plurality of calculated characteristic time intervals over time to determine whether to perform maintenance on the switching device.

DETAILED DESCRIPTION

Exemplary embodiments of monitoring operation of a switching device, such as a circuit breaker, are described herein. A control module coupled to a circuit breaker calculates a characteristic time interval associated with each of a plurality of switching events. By tracking the calculated characteristic time intervals over time, the health and/or condition of the circuit breaker can be monitored, enabling maintenance to be performed on the circuit breaker before the circuit breaker becomes inoperable.

Figure 1:
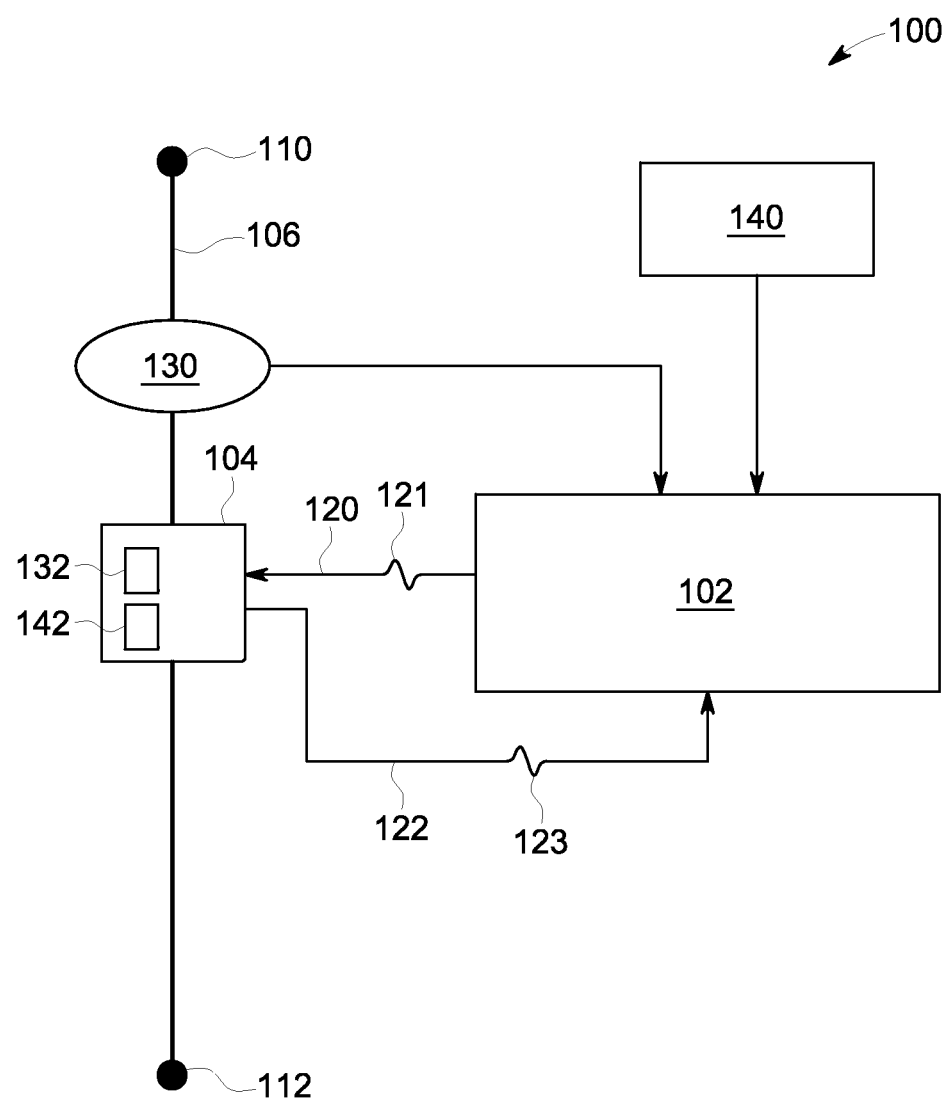
FIG. 1 is a schematic diagram of an exemplary system for monitoring circuit breaker operation.

FIG. 1 is a schematic diagram of an exemplary system 100 for monitoring circuit breaker operation. System 100 includes a control module 102 that controls and monitors operation of a switch, or circuit breaker 104, as described in detail herein. Circuit breaker 104 may be a low, medium, or high voltage circuit breaker. Although referred to herein as a circuit breaker 104, the switch may by any switching device that enables system 100 to function as described herein.

Figure 2:
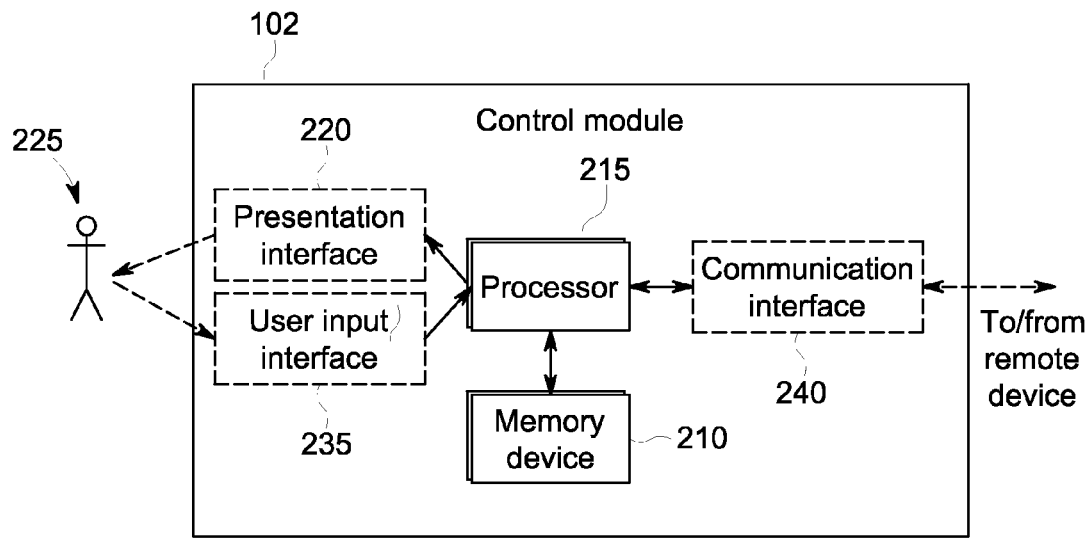
FIG. 2 is a block diagram of a control module that may be used with the system shown in FIG. 1.

FIG. 2 is a block diagram of control module 102. Control module includes at least one memory device 210 and a processor 215 that is coupled to memory device 210 for executing instructions. In some embodiments, executable instructions are stored in memory device 210. In the exemplary embodiment, control module 102 performs one or more operations described herein by programming processor 215. For example, processor 215 may be programmed by encoding an operation as one or more executable instructions and by providing the executable instructions in memory device 210.

Processor 215 may include one or more processing units (e.g., in a multi-core configuration). Further, processor 215 may be implemented using one or more heterogeneous processor systems in which a main processor is present with secondary processors on a single chip. As another illustrative example, processor 215 may be a symmetric multi-processor system containing multiple processors of the same type. Further, processor 215 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein. In the exemplary embodiment, processor 215 determines whether to issue control signals to circuit breaker 104 (shown in FIG. 1) and calculates parameters associated with the operation of circuit breaker 104.

In the exemplary embodiment, memory device 210 is one or more devices that enable information such as executable instructions and/or other data to be stored and retrieved. Memory device 210 may include one or more computer readable media, such as, without limitation, dynamic random access memory (DRAM), static random access memory (SRAM), a solid state disk, and/or a hard disk. Memory device 210 may be configured to store, without limitation, application source code, application object code, source code portions of interest, object code portions of interest, configuration data, execution events and/or any other type of data.

Control module 102 includes a presentation interface 220 that is coupled to processor 215 in the exemplary embodiment. Presentation interface 220 presents information, such as data related to operation of circuit breaker 104, to a user 225. For example, presentation interface 220 may include a display adapter (not shown) that may be coupled to a display device, such as a cathode ray tube (CRT), a liquid crystal display (LCD), an organic LED (OLED) display, and/or an "electronic ink" display. In some embodiments, presentation interface 220 includes one or more display devices.

In the exemplary embodiment, control module 102 includes a user input interface 235 that is coupled to processor 215 and receives input from user 225. User input interface 235 may include, for example, a keyboard, a pointing device, a mouse, a stylus, a touch sensitive panel (e.g., a touch pad or a touch screen), a gyroscope, an accelerometer, a position detector, and/or an audio user input interface. A single component, such as a touch screen, may function as both a display device of presentation interface 220 and user input interface 235.

In the exemplary embodiment, control module 102 includes a communication interface 240 coupled to processor 215. Communication interface 240 communicates with one or more remote devices. To communicate with remote devices, communication interface 240 may include, for example, a wired network adapter, a wireless network adapter, and/or a mobile telecommunications adapter. Communication interface 240 receives and transmits signals between control module 102 and circuit breaker 104 in the exemplary embodiment.

Referring back to FIG. 1, circuit breaker 104 is configured to interrupt current through a conductor 106. More specifically, in a closed state, circuit breaker 104 allows current to flow from a first node 110 to a second node 112, and in an open state, circuit breaker 104 inhibits current to flow from first node 110 to second node 112. Those of skill in the art will appreciate that circuit breaker 104 may be implemented in a variety of electrical systems.

A control bus 120 communicatively couples control module 102 to circuit breaker 104. To control circuit breaker 104, control module 102 generates and issues a control signal 121 to circuit breaker 104 via control bus 120. In the exemplary embodiment, control signal 121 is one of a trip open signal, a control open signal, and a close signal. The control open signal and trip open signal both trigger circuit breaker 104 to open (i.e., switch from the closed state to the open state), and the close signal triggers circuit breaker 104 to close (i.e., switch from the open state to the closed state). That is, circuit breaker 104 opens in response to receiving the control open signal or the trip open signal, and circuit breaker 104 closes in responses to receiving the close signal. A feedback bus 122 transmits a feedback signal 123 from circuit breaker 104 to control module 102 indicating that circuit breaker 104 has performed the requested operation (i.e., opened or closed). In the exemplary embodiment, control bus 120 and feedback bus 122 are separate buses. Alternatively, a single cable may function as both control bus 120 and feedback bus 122.

In the exemplary embodiment, control module 102 generates and issues a trip open signal in response to a fault current signal received from a fault detection device 130 communicatively coupled to control module 102. Fault detection device 130 is located upstream from circuit breaker 104. In response to detecting a fault along conductor 106 (e.g., a current amount exceeding a threshold current value), fault detection device 130 transmits fault current signal to control module 102, which in turn generates and issues the trip open signal to circuit breaker 104. In response to receiving the trip open signal, a device 132 (e.g., a flux shifter and/or solenoid) energizes (i.e., activates) to open circuit breaker 104. As will be appreciated by those of skill in the art, fault detection device 130 may be any device capable of detecting a fault along conductor 106.

Control module 102 generates and issues a control open signal in response to an external open signal received from an external control device 140 communicatively coupled to control module 102. External control device 140 may be, for example, an external protective relay, a programmable logic controller (PLC), or any supervisory control device or system making separate protection and/or control decisions that utilize operation of circuit breaker 104. For example, external control device 140 may include external circuitry that issues a command to control module 102 or an external automation system that monitors and controls a power distribution system (e.g., by issuing an open command to control module 102) for optimal operation under a variety of conditions. External control device 140 is external in that it is coupled to control module 102, but is not structurally part of control module 102 and/or circuit breaker 104.

In response to receiving external open signal, a device 142 (e.g., a shunt trip and/or solenoid) activates to open circuit breaker 104. In general, a trip open signal causes circuit breaker 104 to open faster than a control open signal. As will be appreciated by those of skill in the art, circuit breaker 104 may be any device capable of interrupting current flow through conductor 106.

As used herein, a switching event includes generating and issuing, or transmitting, control signal 121 (i.e., trip open signal, control open signal, or close signal) from control module 102 to circuit breaker 104, and receiving feedback signal 123 from circuit breaker 104 at control module 102. By calculating and storing a characteristic time difference, $t_d$, (also referred to herein as a characteristic time interval) for each of a plurality of switching events, the operation and/or health of circuit breaker 104 may be monitored, as described herein.

In the exemplary embodiment, in a switching event, control module 102 issues control signal 121 to circuit breaker 104 at a first time, $t_1$, and control module 102 receives the associated feedback signal 123 from circuit breaker 104 at a second time, $t_2$. The first and second times $t_1$ and $t_2$ are stored in memory device 210 (shown in FIG. 2). Alternatively, the first and second times $t_1$ and $t_2$ may be stored in a memory device external to control module 102.

Using the stored first and second times $t_1$ and $t_2$, processor 215 (shown in FIG. 2) calculates the characteristic time difference $t_d$ for the switching event. Specifically, the characteristic time difference $t_d$ is the time elapsed, or the time period, between the first time $t_1$ and the second time $t_2$ (i.e., $t_d = t_2 - t_1$). The calculated characteristic time difference $t_d$ is also stored in memory device 210 (or alternatively, a memory device external to control module 102). In the exemplary embodiment, the characteristic time difference $t_d$ is calculated in milliseconds (ms). Alternatively, the characteristic time difference $t_d$ may be calculated in any units that enable system 100 to function as described herein.

In the exemplary embodiment, the first time $t_1$ is a time at which control module 102 issues control signal 121 and the second time $t_2$ is a time at which control module 102 receives feedback signal 123. Alternatively, the first and second times $t_1$ and $t_2$ may be any times that may be used to monitor the condition and/or health of circuit breaker 104 (i.e., any times that may be used as a proxy for an elapsed time between issuing control signal 121 and operating circuit breaker 104 in response to control signal 121). For example, the first and second times $t_1$ and $t_2$ could include, but are not limited to, a time at which fault detection device 130 detects a fault, a time at which control module 102 receives a fault current signal from fault detection device 130, a time at which control module 102 receives an external open signal from external control device 140, a time at which control module 102 issues control signal 121 to circuit breaker 104, a time at which contacts (not shown) of circuit breaker 104 begin opening or closing, a time at which current through conductor 106 is fully interrupted, and a time at which feedback signal 123 is received at control module 102.

By tracking the characteristic time difference $t_d$ for a plurality of switching events, the health and/or operation of circuit breaker 104 over time can be monitored. In the exemplary embodiment, the characteristic time difference $t_d$ is related to a mechanical switching time of circuit breaker 104 (i.e., the time it takes circuit breaker 104 to mechanically switch between closed and open states). As used herein, switching between closed and open states may include both switching from a closed state to an open state and switching from an open state to a closed state. Accordingly, if the characteristic time difference $t_d$ increases over a plurality of switch events, it may be indicative of mechanical problems in circuit breaker 104. Further, for a plurality of switching events occurring after a relatively long period of time when circuit breaker 104 goes unused, the characteristic time difference $t_d$ may decrease over time as circuit breaker 104 is "broken in". For example, if rust has accumulated on one or more components of circuit breaker 104, repeated switching events may dislodge at least some of the rust, decreasing the mechanical switching time. Further, processor 215 may track the characteristic time difference $t_d$ for different types of control signals 121 (i.e., trip open signal, control open signal, and close signal) separately.

In some embodiments, processor 215 may generate and display (using, e.g., presentation interface 220) data tracking the characteristic time difference $t_d$ over a plurality of switching events. The data may be generated in response to user input received at user input interface 235 (shown in FIG. 2). As used herein, data may include plots, graphs, tables, and/or any other method of displaying data to user 225. By tracking the characteristic time difference $t_d$ over a plurality of switching events, prior to circuit breaker 104 actually becoming inoperable, user 225 may determine that circuit breaker 104 requires maintenance (i.e., repairing and/or replacing one or more components of circuit breaker 104), increasing reliability and safety of electrical systems that include circuit breaker 104.

Figure 3:
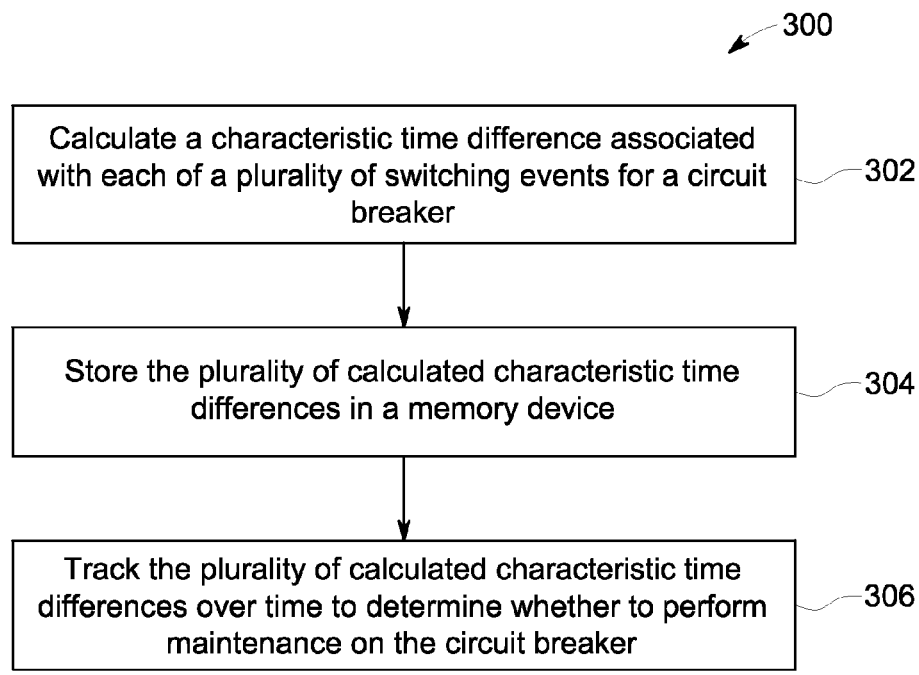
FIG. 3 is flow chart of an exemplary method for monitoring circuit breaker operation.

FIG. 3 is flow chart of an exemplary method 300 for monitoring circuit breaker operation, such as operation of circuit breaker 104 (shown in FIG. 1). A processing device, such as processor 215 (shown in FIG. 2), calculates 302 a characteristic time difference, or interval, associated with each of a plurality of switching events. The characteristic time difference is indicative of a mechanical switching time of the circuit breaker. The plurality of calculated characteristic time differences are stored 304 in a memory device coupled to the processing device, such as memory device 210 (shown in FIG. 2). The plurality of calculated characteristic time differences are tracked 306 to determine whether to perform maintenance on the circuit breaker. For example, maintenance may need to be performed if the plurality of characteristic time differences increase over time.

Figure 4:
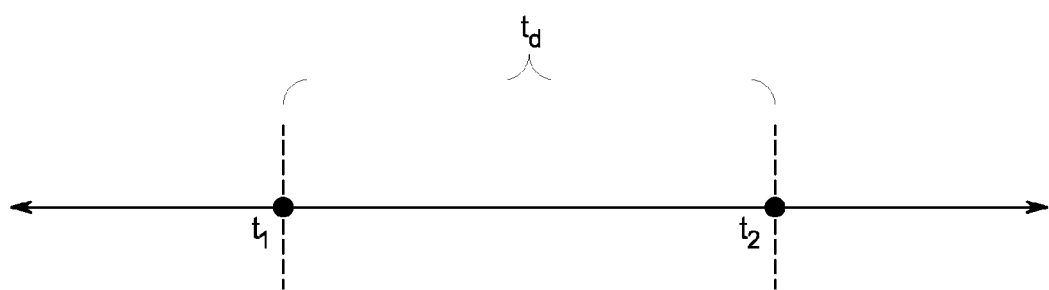
FIG. 4 is a diagram illustrating a characteristic time interval.

FIG. 4 is a diagram illustrating the characteristic time interval, or characteristic time difference, $t_d$. As explained above, the characteristic time interval $t_d$ is the period of time between a first time $t_1$ and a second time $t_2$ (i.e., $t_d = t_2 - t_1$).

A technical effect of the methods and systems described herein may include one or more of: (a) issuing, as part of a switching event, a control signal to a switching device that triggers the switching device to switch between an open state and a closed state; (b) receiving, as part of the switching event, a feedback signal from the switching device indicating that the switching device has switched between the open state and the closed state; and (c) calculating a characteristic time interval for the switching event, wherein the characteristic time difference is indicative of a mechanical switching time of the switching device.

Exemplary embodiments of systems and methods for monitoring circuit breaker operation are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A control module coupled to a switching device that is switchable between an open state and a closed state as part of a switching event, said control module comprising:
   a communication interface configured to:
      issue a control signal to the switching device that triggers the switching device to switch between the open state and the closed state; and
      receive a feedback signal from the switching device indicating that the switching device has switched between the open state and the closed state;
   a processing device coupled to said communication interface and configured to calculate a characteristic time interval associated with the switching event, wherein the characteristic time interval is indicative of a mechanical switching time of the switching device; and
   a memory device coupled to said processing device and configured to store the calculated characteristic time interval.

2. A control module in accordance with claim 1, wherein the characteristic time interval is between a first time when the control signal is issued and a second time when the feedback signal is received.

3. A control module in accordance with claim 1, wherein the control signal is a control open signal that activates a device in the switching device to switch the switching device from the closed state to the open state.

4. A control module in accordance with claim 1, wherein the control signal is a trip open signal that activates a solenoid in the switching device to switch the switching device from the closed state to the open state.

5. A control module in accordance with claim 1, wherein the control signal is a close signal that causes the switching device to switch from the open state to the closed state.

6. A control module in accordance with claim 1, wherein said processing device is configured to calculate a plurality of characteristic time intervals each associated with one of a plurality of switching events, and wherein said memory device is configured to store the plurality of calculated characteristic time intervals.

7. A control module in accordance with claim 6, further comprising a presentation interface configured to display data indicative of the plurality of calculated characteristic time intervals over time.

8. A system for monitoring switching device operation, said system comprising:
   a switching device configured to switch between an open state and a closed state as part of a switching event to control a current through a conductor; and
   a control module communicatively coupled to said switching device, wherein said control module is configured to:
      issue a control signal to said switching device that triggers said switching device to switch between the open state and the closed state;
      receive a feedback signal from said switching device indicating that said switching device has switched between the open state and the closed state; and
      calculate a characteristic time interval associated with the switching event, wherein the characteristic time interval is indicative of a mechanical switching time of said switching device.

9. A system in accordance with claim 8, wherein the characteristic time interval is between a first time when the control signal is issued and a second time when the feedback signal is received.

10. A system in accordance with claim 8, further comprising a fault detection device communicatively coupled to said control module, wherein to issue a control signal, said control module is configured to issue a trip open signal in response to a fault current signal received from said fault detection device.

11. A system in accordance with claim 10, wherein said switching device comprises a device, and wherein the trip open signal activates said device to switch said switching device from the closed state to the open state.

12. A system in accordance with claim 8, further comprising an external control device communicatively coupled to said control module, wherein to issue a control signal, said control module is configured to issue a control open signal in response to an external open signal received from said external control device.

13. A system in accordance with claim 12, wherein said switching device comprises a device, and wherein the control open signal activates said device to switch said switching device from the closed state to the open state.

14. A system in accordance with claim 8, wherein said control module is configured to calculate characteristic time intervals associated with a plurality of switching events.

15. A method for monitoring operation of a switching device, said method comprising:
   calculating, using a processing device, a characteristic time interval associated with each of a plurality of switching events, wherein each characteristic time interval is indicative of a mechanical switching time of the switching device;
   storing the plurality of calculated characteristic time intervals in a memory device communicatively coupled to the processing device; and
   tracking the plurality of calculated characteristic time intervals over time to determine whether to perform maintenance on the switching device.

16. A method in accordance with claim 15, wherein calculating a characteristic time interval comprises calculating the characteristic time interval associated with each switching event as a time period between a first time when a control signal is issued from a control module to the switching device and a second time when a feedback signal from the switching device is received at the control module.

17. A method in accordance with claim 15, further comprising determining to perform maintenance on the switching device when the plurality of calculated characteristic time intervals increase over time.

18. A method in accordance with claim 15, further comprising displaying data including the tracked plurality of calculated characteristic time intervals over time.

19. A method in accordance with claim 15, wherein calculating a characteristic time interval comprises calculating the characteristic time interval associated with each switching event as a time period between a first time when a control open signal is issued from a control module to the switching device and a second time when a feedback signal from the switching device is received at the control module.

20. A method in accordance with claim 15, wherein calculating a characteristic time interval comprises calculating the characteristic time interval associated with each switching event as a time period between a first time when a trip open signal is issued from a control module to the switching device and a second time when a feedback signal from the switching device is received at the control module.

* * * * *